United States Patent [19]

Leas

[11] Patent Number: 4,511,600
[45] Date of Patent: Apr. 16, 1985

[54] SOLAR CELL METAL SPRAY PROCESS

[75] Inventor: James M. Leas, Bethesda, Md.

[73] Assignee: Solarex Corporation, Rockville, Md.

[21] Appl. No.: 579,126

[22] Filed: Feb. 10, 1984

[51] Int. Cl.³ .................... H01L 21/283; H01L 31/04
[52] U.S. Cl. ........................................ 427/75; 427/85;
427/88; 427/90; 427/422; 427/424; 427/427;
136/256; 29/572
[58] Field of Search .......................... 29/572; 136/256;
118/302, 314, 315; 427/75, 90, 88, 422, 424,
427, 85

[56] References Cited

U.S. PATENT DOCUMENTS

| | | | |
|---|---|---|---|
| 2,512,743 | 6/1950 | Hansell | 118/300 X |
| 2,916,012 | 12/1959 | Hergenrother | 118/315 |
| 3,222,776 | 12/1965 | Kawecki | 29/503 |
| 3,734,762 | 5/1973 | Hackman et al. | 117/37 R |
| 3,775,156 | 11/1973 | Singer | 118/302 X |
| 3,982,964 | 9/1976 | Lindmayer et al. | 136/89 |
| 4,031,268 | 6/1977 | Fairbairn | 118/302 X |
| 4,224,356 | 9/1980 | Singer | 427/34 |
| 4,240,842 | 12/1980 | Lindmayer | 136/256 |
| 4,278,045 | 7/1981 | Ahmad | 118/323 |
| 4,297,391 | 10/1981 | Lindmayer | 136/256 |
| 4,318,938 | 3/1982 | Barnett et al. | 427/75 |
| 4,320,251 | 3/1982 | Narasimhan et al. | 136/256 |
| 4,331,703 | 5/1982 | Lindmayer | 427/37 |

Primary Examiner—John D. Smith
Assistant Examiner—Bernard F. Plantz
Attorney, Agent, or Firm—Finnegan, Henderson, Farabow, Garrett and Dunner

[57] ABSTRACT

The present invention provides a method of forming a metal pattern on a solar cell comprising the steps of forcing a molten metal through an aligned array of orifices by use of gas pressure; vibrating the aligned array of orifices to form the molten metal issuing from the orifices into metal droplets; moving a solar cell collinearly with the aligned array of orifices; and allowing each series of metal droplets from a single orifice to fall onto a specific region of the solar cell to build up a metal layer of increasing thickness, each metal droplet being permitted sufficient time to solidify prior to allowing the next metal droplet to strike the metal layer.

11 Claims, 6 Drawing Figures

SOLAR CELL METAL SPRAY PROCESS

FIELD OF THE INVENTION

The present invention relates to solar cells and, more particularly, to a method of forming a metal pattern on a solar cell.

BACKGROUND OF THE INVENTION

The use of metal spraying to coat surfaces is a well-established technology dating back to the early 1900's. Generally, three types of spray guns, categorized according to the state of the source metal, are used in metal spraying. Specifically, the spray guns have a metal source of either molten metal held in a crucible, a metal wire, or a metal powder.

In one process of metallizing solar cells, a spray of molten metal is directed at the cell from a standard commercial arc spray gun. In the arc spray gun, an electric arc is struck across an air gap between the tips of two wires. The heat, generated by the arc, melts the metal tips, and forms metal droplets at the end of each wire. A high pressure gas, typically nitrogen, is directed through a nozzle toward the two molten metal droplets to disperse the droplets into a fine mist of molten metal particles.

The high pressure gas further directs the metal droplets in an expanding beam toward the solar cell. To control the location of the metal droplet contact with the solar cell, a shadow mask covers each solar cell. The cell and mask are on a moving belt, i.e., they move relative to the arc spray gun to receive the metal spray from the gun. The metal wire is fed mechanically to the arc gun to maintain the production of the metal spray by the arc gun.

Standard metal spray processes, including the wire source arc spray process, have several important disadvantages for solar cell metallization. Typically, only a small fraction of the metal sprayed by the arc gun ever hits the target cell. For solar cell front metallization, it is usually desired that only about 10% of the front surface area actually be covered by metal; the other 90% is free of metal to allow sunlight to strike the cell. Consequently, the arc gun shadow mask technique wastes 90% of the sprayed metal, since the mask will cover 90% of the cell and, consequently, receive 90% of the metal spray. Furthermore, about half of the metal spray, which is to fall on the 10% of the cell that is to be covered by the metal, entirely misses the cell to achieve a uniform coating on the cell. Thus, metal spray efficiency is, at best, 5%.

In the standard metal spray process, in addition to the metal itself, large quantities of nitrogen gas are also consumed. The significant consumption of gas accounts for a large fraction of the material cost in the spray operation. Therefore, the standard metal spray process is relatively uneconomical due to the significant waste and consumption of both metal and gas materials.

Moreover, the conductivity of the aluminum arc sprayed on a cell is only 10% of the conductivity of the source aluminum wire, due to the oxidation of the surface layer of each aluminum droplet as the beam of aluminum droplets moves through the air toward the target cell. Such a decrease in metal conductivity occurs despite the use of nitrogen as the directing gas, because ordinary air is still present in the ambient gas surrounding the spray gun and the receiving cell. Air must be used as the ambient gas to avoid an explosion of the aluminum, since unoxidized aluminum dust poses a high explosion hazard.

As a result of the sharply reduced conductivity of the arc sprayed aluminum, much wider and thicker metal fingers are needed on the cell, than would be required if pure unoxidized aluminum were used. Because of the extra shadowing that results from the use of these wider fingers, the solar cell is less efficient.

Furthermore, the shadow masking of each solar cell sharply limits throughput, and introduces various defects and gaps in the metallization grid, as the fine lines on the mask often become clogged with the sprayed metal. As a result, the line width must be large enough to avoid frequent clogging and to allow for mask cleaning. The height of the sprayed metal, formed on the cell, is also limited by the need to remove the shadow mask from the cell, without breaking either the cell or its metal grid. Therefore, solar cell efficiency is significantly reduced and the production cost is sharply increased.

Arc spray tools, used in the process, produce a broad spectrum of metal droplet sizes, from less than 1 $\mu$m to over 100 $\mu$m. Typically, a large number of small metal droplets solidify prior to striking the cell and fail to adhere to the cell. These solidified particles bounce off and produce a fine metal dust that must be removed by vacuum equipment.

Large aluminum droplets cause important degradation in solar cell performance, since silicon dissolves in the molten aluminum. If the aluminum droplet is large enough, some of the silicon of the cell will dissolve in the aluminum. As a result, the aluminum penetrates the thin diffused layer of the cell and shorts the p-n junction. Shorting or shunting renders the cell less efficient with reduced output power.

In arc spray processing, shunting is reduced both by the use of high pressure nitrogen to disperse the aluminum droplets as small sized droplets, and by the introduction of an interfacial oxide film on the surface of the silicon and the aluminum droplets. Despite these measures, cell shunting is a major problem in arc sprayed cells.

A further disadvantage to the spray process is that it produces a large quantity of metal dust material, which typically is blown up a stack into the atmosphere. Such an emission of metal dust poses numerous safety, health, and environmental hazards.

One method that has been used in semiconductor processing for forming evaporated aluminum contacts has been to introduce additional silicon into the aluminum droplets. The added silicon is dissolved in the aluminum to prevent the silicon from the cell being dissolved by the aluminum droplets. This process reduces the aluminum penetration and the shunting of the cell junctions. The use of this technique is sharply restricted, however, since the doping of solid aluminum with silicon cannot exceed 1 or 2%.

SUMMARY OF THE INVENTION

It is, therefore, a main object of the present invention to provide a method of forming a metal pattern on a solar cell, which overcomes the afore-mentioned drawbacks.

It is a more specific object of the present invention to provide a method of forming a solar cell that has a metal pattern of increased conductivity.

It is another object of the present invention to provide a method of forming a metal pattern on a solar that permits the use of an inert atmosphere around the solar cell without posing an explosion hazard.

It is another object of the present invention to form the desired metal pattern on the solar cell without the need of using a mask to cover portions of the cell.

It is another object of the present invention to provide a method of forming a metal pattern on a solar cell that is efficient and economical to use.

Additional objects and advantages of the invention will be set forth in part in the description which follows, and in part will be obvious from the description, or may be learned by practice of the invention. The objects and advantages of the invention may be realized and obtained by means of instrumentalities and combinations particularly pointed out in the appended claims.

To achieve these and other objectives, the present invention provides a method of forming a metal pattern on a solar cell. The method includes the steps of forcing a molten metal through an aligned array of orifices by use of a gas pressure; vibrating the aligned array of orifices to form the molten metal issuing from the orifices into metal droplets; moving a solar cell collinearly with the aligned array of orifices; and allowing each series of metal droplets from a single orifice to fall onto a specific region of the solar cell to build up a metal layer of increasing thickness, each metal droplet in the metal layer being permitted sufficient time to solidify prior to allowing the next metal droplet to strike the metal layer.

The present invention obviates the inherent disadvantages of previous processes and meets the various objectives of the invention. The method of the present invention forms a metal pattern on a solar cell. The present method allows the use of an inert atmosphere that reduces the oxidation of the molten metal, without posing an explosion hazard. As a result, the resistivity of the metal pattern on the cell is decreased and, conversely, the conductivity of the solar cell is enhanced.

The present method also eliminates the need of using a mask to cover portions of the cell during the spraying process. Since there is a minimal wastage of metal and an insignificant consumption of gas, the present method is relatively efficient and economical to use.

The foregoing and other objects, features, and advantages of the present invention will be made more apparent from the following description of the preferred embodiments.

BRIEF DESCRIPTION OF THE DRAWINGS

The accompanying drawings, which are incorporated in and constitute a part of the specification, illustrate at least one embodiment of the invention and, together with the description, serve to explain the principles of the invention.

DESCRIPTION OF THE PREFERRED EMBODIMENT

The present invention provides a method of forming a metal pattern on a solar cell. The method includes the steps of forcing a molten metal through an aligned array of orifices by use of a gas pressure. The aligned array of orifices are vibrated to form the molten metal issuing from the orifices into metal droplets. A solar cell is moved collinearly with the aligned array of orifices. Each series of metal droplets from a single orifice is allowed to fall onto a specific region of the solar cell to build up a metal layer of increasing thickness. Each metal droplet in the metal layer is permitted a sufficient time to solidify prior to allowing the next metal droplet to strike the metal layer.

In the present method, metal droplets of uniform size are produced at a multi-orifice nozzle and are aimed at a cell to directly form a metal pattern on the cell, without the need of placing a mask on the cell. Initially, the molten metal is forced through an aligned array of orifices by use of a gas pressure. Preferably, a crucible of molten metal is held above the cells, which are moving on a moveable belt positioned below the orifices. The crucible is enclosed so that gas pressure from above the metal melt forces the liquid metal through the orifices of the multi-orifice nozzle that is positioned at the base of the crucible.

The aligned array of orifices in the nozzle is vibrated to form metal droplets out of the molten metal issuing from the orifices. Upon leaving the vibrating nozzle, each stream of molten metal breaks up into fine metal droplets. The size of each metal droplet is controlled by the orifice diameter, the gas pressure, the viscosity of the molten metal, and the frequency of the mechanical vibration that is applied to the nozzle.

The metal droplets, issuing from the orifices, are not further dispersed by any stream of gas, as in standard tools. Instead, each stream of metal droplets travels undisturbed by gravity to the target cell. If the cells were positioned stationary underneath the orifices, the pattern of orifices in the nozzle would be duplicated as metal dots on the cell. However, if the cell is moving collinearly relative to the aligned array of orifices as in the present invention, then a pattern of fine lines, appropriate for use in a solar cell, is formed on the cell. Such a method of metal droplet production ensures metal droplet size uniformity.

Figure 6:
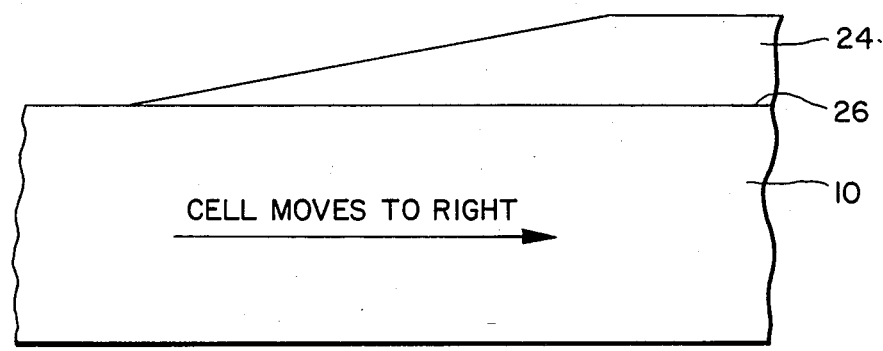
FIG. 6 is a front schematic diagram of a solar cell metal finger as it is being formed by the present invention.

Each series of metal droplets, issuing from a single orifice, falls onto a specific region of the solar cell to build up a metal layer of increasing thickness, as shown in FIG. 6. Each metal droplet in the metal layer is permitted sufficient time to solidify prior to allowing the next metal droplet to strike the metal layer.

The present process eliminates a significant portion of metal dust production, since the metal droplets that miss falling on the cell stick to the moveable belt on which the cells are placed. In the present process, there is neither the random spraying of aluminum nor the formation of loose aluminum dust, as in previous processes. Consequently, a non-oxidizing ambient atmosphere, such as inert gas, can be used in the present process. The presence of a nonoxidizing ambient atmosphere reduces the oxidation of the aluminum metal to be deposited on the cell, which previously decreased the resistivity of the metal pattern. As a result, the conductivity of cell is increased, without the danger of an explosion due to metal dust as in previous processes.

Preferably, an inert gas is used to provide the gas pressure in the nozzle to force the molten metal through the aligned array of orifices. The inert gas is selected from the group consisting of nitrogen gas, hydrogen gas, and the noble gases. Typical noble gases include argon and neon. Gas pressure is applied above the molten metal to force the metal droplets out of the nozzle. The gas remains in the nozzle, however, and very little gas is actually consumed in the process.

The present process, likewise, requires a crucible for maintaining the metal at its melting point. For aluminum, the melting point temperature is between 577° C. and 660° C., depending upon the amount of silicon that is doped into the aluminum. The crucible and the nozzle can be made of heavily oxidized silicon or quartz. The gas pressure can be applied to the molten metal in the nozzle and crucible, by enclosing the crucible and regulating the pressure of the gas above the molten metal in the nozzles and crucibles. The feed aluminum or the aluminum that is doped with silicon in the crucible can be either replaced periodically or added continuously from a supply source.

Figure 1:
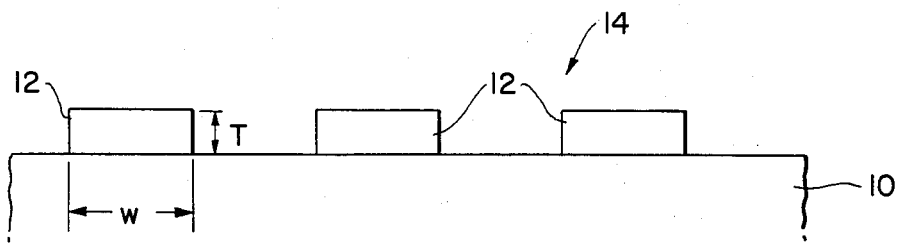
FIG. 1 is an end view of a solar cell containing a metal pattern formed in accordance with the present method.

For a solar cell, it is desirable to form a metal pattern having metal lines on the cell that are about 15 μm and 300 μm wide and about 10 μm to 100 μm thick. The separation between the metal lines should be in the range of about 1 mm to 10 mm. FIG. 1 presents the metallization of a typical solar cell 10 having metal lines or fingers 12 that form a metal pattern 14.

When pure aluminum metal is sprayed on a bare silicon cell, metal droplets, no larger than a few micrometers in diameter, are needed to prevent the shunting of the junction. If there is also present either an interfacial film of oxide or a silicon doping of the aluminum melt, the metal droplets can be larger and still avoid shunting. Typically, to produce metal droplets of this size, the nozzle dimensions can be about 1 μm to 50 μm.

Figure 2:
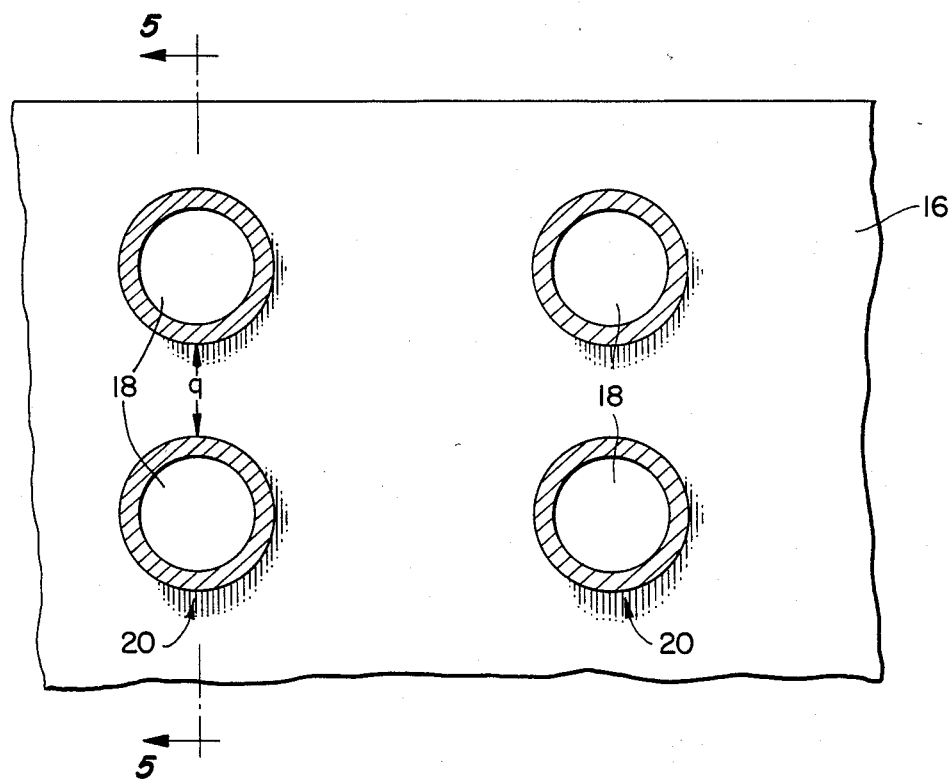
FIG. 2 is a top view of a portion of a nozzle, containing an aligned array of orifices, used in the present method.
Figure 3:
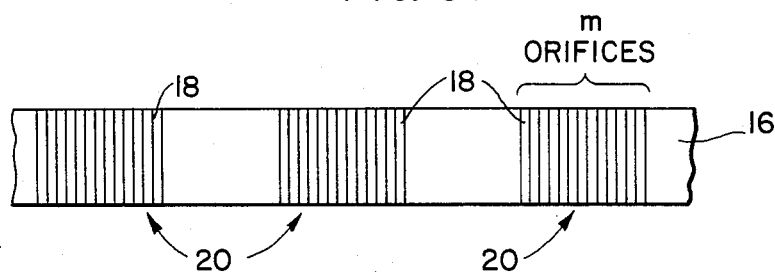
FIG. 3 is an end view of the nozzle shown in FIG. 2 showing arrays of orifices for each finger.
Figure 4:
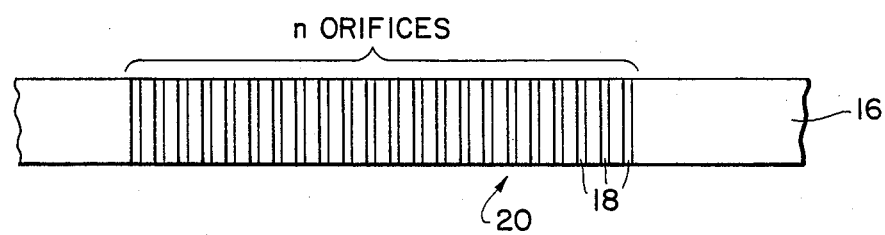
FIG. 4 is a side view of the nozzle, shown in FIG. 2 showing the detail of one array of orifices for one finger.

Views of a typical nozzle and orifice arrangement are presented in FIGS. 2 to 4. In a preferred embodiment, a nozzle 16 has a plurality of orifices 18 that form an aligned array 20.

As the solar cell moves under the nozzle 16 that contains the aligned array 20 of orifices 18, layers 24 of metal are deposited on the surfaces 26 of the cell 10, as shown in FIG. 6. The thickness (T) of the metal layer is determined by: the speed (v) of the moveable belt carrying the cells; the number (n) of the orifices in the nozzle along the length of each aligned array; the frequency (p) the metal droplets fall from each orifice; and the diameter (h) of each melt droplet. Equation (1) summarizes the relationship among these parameters, as follows:

$$T = \frac{\pi h^2 n p}{6v} \quad (1)$$

To prevent the shunting of the diffused junction, each metal droplet falls distinctly on the cell and solidifies prior to having another metal droplet strike it. Otherwise, if each metal droplet is not allowed to solidify before another metal droplet strikes it, thicker layers of molten metal would be produced, into which a deeper layer of silicon would dissolve. The separation of adjacent metal droplets determines the maximum droplet production rate (p) for various belt speeds (v) and metal droplet diameter (h), in accordance with equation (2):

$$p \leq \frac{v}{h} \quad (2)$$

For a typical belt speed (v) of 1 cm/s and for metal droplets of 5 μm in diameter (h), the metal droplet production rate (p) is less than 2,000 metal droplets per second.

The number (n) of orifices 18 along each aligned array 20 in the nozzle 16 is found by substituting equation (2) into equation (1) to produce equation (3):

$$n = \frac{6T}{\pi h} \quad (3)$$

For a typical metal layer of a thickness (T) of 100 μm and for metal droplets of a diameter (h) of 5 μm, at least about 40 orifices 18 in the nozzle 16 along each aligned array 20 are required.

The spacing (q) between the orifices 18 on the nozzle (16) is also determined by the requirement that a sufficient time is to lapse so that one metal droplet solidifies on the metal layer before a second metal droplet strikes it. This spacing requirement is provided in equation (4), as follows:

$$q = v t_s \quad (4)$$

wherein $t_s$ is the time required for a metal droplet to solidify after it has landed on the cell surface. This time can be calculated from the metal droplet diameter (h) and the thermal parameters of the cell. If $t_s$ is about 10 ms, then the orifices 18 can be about 0.01 cm apart in the aligned array 20.

The width (w) of each line is determined by the number (m) of adjacent arrays 20 of the orifices 18, in accordance with equation (5):

$$m \cong \frac{w}{h} \quad (5)$$

For a typical line width of 100 μm and for metal droplets of a diameter (h) of 5 μm, about 20 aligned arrays 20 of orifices 18 for each finger is needed.

Each solar cell requires many fingers, typically between 2 and 10 per centimeter. The spacing between the lines on the cell is determined from the sheet resistance of the silicon diffused layer; the line width; the conductivity of the metal; and the power output of the cell. The spacing is established to minimize cell losses due to shadowing and series resistance. For highest throughput, multiple arrays 20 of nozzle orifices 18 are needed, with one array 20, as described above, being used to form each finger 12, as shown in FIG. 1, on the solar cell 10.

The multi-orifice nozzle generally requires: (a) accurately positioned orifices 18 that are patterned in arrays 20, as shown in FIGS. 2 to 3; (b) accurately sized orifices 18, usually of about 1 μm to 50 μm in diameter; and (c) material impervious to molten aluminum or another metal used to form the layer on the cell at the melting temperature of the metals. Aluminum has a melting temperature of about 660° C.

A thermally oxidized, etched silicon nozzle 16 provides one means of meeting these requirements. A silicon wafer of about 0.1 cm to 1 cm thickness is patterned photolithographically and etched, either chemically or by a reactive ion etch process, to form a nozzle 16 having the desired arrays 20 of orifices 18.

Figure 5:
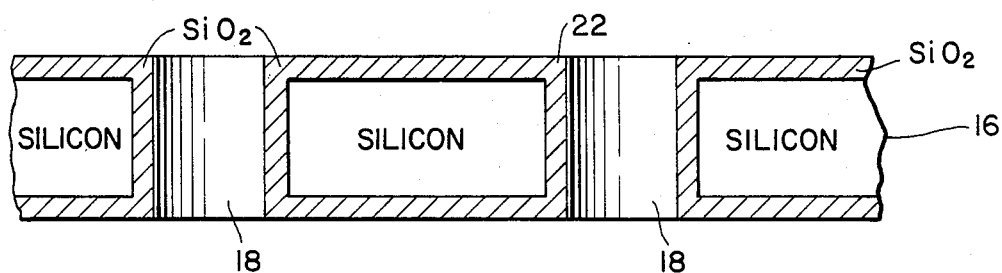
FIG. 5 is a cross-sectional view of the nozzle taken along line 5—5 in FIG. 2.

After etching, the wafer is oxidized in steam to form a thick layer 22 of $SiO_2$ of about 0.5 $\mu$m to 5 $\mu$m thickness (FIG. 5). This quartz film protects the silicon of the nozzle 16 from the molten aluminum, and it does not react with the molten aluminum. Such a quartz film is capable of withstanding the thermal stresses of the present process. Alternatively, the nozzle 16 can also be made of a sheet of glass or quartz, or from orifices 18 that are laser drilled.

In the present process, the molten metal, such as aluminum, can be doped with silicon to a greater degree, than in previous processes. Consequently, the depth the metal droplets are alloyed with the solar cell can be controlled simply by adjusting the silicon content of the feed molten aluminum. In the molten state with the present method, any concentration of silicon is physically possible. Preferably, about 3% to 15% of the metal droplet is silicon, with the remainder being aluminum. If the molten aluminum is doped with 9% silicon, then the alloying depth can be reduced by an order of magnitude.

No masking of the solar cell is needed in the present process, since the nozzle 16 writes line patterns directly onto the cell. The pattern formed by the orifices 18 on the nozzle 16 determines the pattern of the lines on the resulting solar cell. Lines of very small dimensions, with a high thickness, can be achieved, in comparison to the metal lines of high resistivity, produced by previous arc spray processes.

Almost all of the aluminum sprayed on the cells falls on the cells, in the present process, to avoid the wasting of the molten metal. Rectangular or square cells can be arranged to form a continuous ribbon on the moveable belt under the nozzle to eliminate the wasting of metal that falls between the cells and to increase the production rate of the process.

The apparatus used to perform the present process can include various nozzles, crucibles, moving belts, and nozzle vibrators that would be known to one skilled in the art. The apparatus, as well as the construction and assembly of the apparatus, depend upon the type and size of the metal pattern being formed on the solar cell. However, the apparatus, construction, and assembly are to be selected and designed to embody and be consistent with the above description of the process, including the various operational parameters.

It will be apparent to those skilled in the art that various other modifications and variations could be made in the method of the invention, without parting from the scope or content of the invention.

What is claimed is:

1. A method of forming a metal pattern on a solar cell, comprising the steps of:
    (a) forcing a molten metal through an aligned array of orifices by use of gas pressure;
    (b) vibrating the aligned array of orifices to form the molten metal issuing from the orifices into metal droplets;
    (c) moving a solar cell collinearly with the aligned array of orifices; and
    (d) allowing each series of metal droplets from a single orifice to fall onto a specific region of the solar cell to build up a metal layer of increasing thickness, each metal droplet in the metal layer being permitted sufficient time to solidify prior to allowing the next metal droplet to strike the metal layer.

2. A method of claim 1, wherein the molten metal is forced through the aligned array of orifices by use of an inert gas.

3. A method of claim 1, wherein the inert gas is selected from the group consisting of nitrogen gas, hydrogen gas, and the noble gasses.

4. A method of claim 1, wherein a plurality of aligned arrays of orifices are parallelly arranged.

5. A method of claim 1, wherein the aligned array of orifices are contained within a nozzle.

6. A method of claim 1, wherein the method is conducted within an inert atmosphere.

7. A method of claim 1, wherein the molten metal is aluminum.

8. A method of claim 1, wherein the aluminum is doped with 3% to 15% of silicon.

9. A method of claim 1, wherein the solar cell is composed of silicon.

10. A method of claim 1, further comprising the step of controlling the size of the droplets by varying at least one parameter selected from the group consisting of the orifice diameter, the gas pressure, the molten metal viscosity, and the orifice vibration frequency.

11. A method of claim 1, further comprising the step of controlling the thickness of the metal layer by varying at least one parameter selected from the group consisting of the solar cell movement speed, the number of orifices, the rate the metal droplets issue from each orifice, and the size of each metal droplet.

* * * * *